United States Patent [19]

Naka et al.

[11] Patent Number: 5,225,695
[45] Date of Patent: Jul. 6, 1993

[54] SOLID-STATE IMAGING DEVICE HAVING MULTIPLE CHARGE DETECTORS

[75] Inventors: Shunichi Naka, Habikino; Takashi Watanabe, Soraku, both of Japan

[73] Assignee: Sharp Kabushiki Kaisha, Osaka, Japan

[21] Appl. No.: 831,209

[22] Filed: Feb. 7, 1992

[30] Foreign Application Priority Data

Feb. 8, 1991 [JP] Japan .................................. 3-17493

[51] Int. Cl.$^5$ ..................... H01L 29/78; H01L 27/14; H01L 31/00
[52] U.S. Cl. .................................. 257/239; 257/231; 257/236; 257/241
[58] Field of Search ............... 357/24, 24 M, 24 LR; 377/60, 61, 62, 63; 257/231, 236, 239, 240, 241

[56] References Cited

U.S. PATENT DOCUMENTS 4,567,524 1/1986 Levine ........................... 357/24 LR
4,649,554 3/1987 Boudewijns et al. .

OTHER PUBLICATIONS

Y. Kiriyama, Japanese Laid-Open Patent Publication No. 3-159382, laid-open date of Jul. 9, 1991.

Primary Examiner—Andrew J. James
Assistant Examiner—Ngan Van Ngo
Attorney, Agent, or Firm—David G. Conlin; George W. Neuner; Peter F. Corless

[57] ABSTRACT

A solid-state imaging device of the invention is provided with a CCD-structured branching unit which selects one signal charge sensor having characteristics suitable for the conditions of use from among a plurality of signal charge sensors each having different characteristics and forms a signal charge transmission path leading from the horizontal CCD to the selected signal charge sensor. As a result, there is no need to switch over the external circuit of the solid-state imaging device according to the conditions of use, which makes it possible to hold down the cost and reduce the size of the external size.

4 Claims, 3 Drawing Sheets

SOLID-STATE IMAGING DEVICE HAVING MULTIPLE CHARGE DETECTORS

BACKGROUND OF THE INVENTION

1. Field of the Invention

The present invention relates to a solid-state imaging device that utilizes charge-coupled devices (CCDs) that is used as an area sensor, a line sensor, or the like.

2. Description of the Prior Art

Signal charge sensing methods employed for a signal charge sensor that forms the output part of a solid-state imaging device constructed from CCDs include, for example, a current output method, a floating-diffusion amplifier method, and a floating-gate amplifier method. The characteristics such as the sensitivity and dynamic range differ among these signal charge sensing methods, each method having its own advantages and disadvantages. Even in the case of signal charge sensors employing the same sensing method, the characteristics such as the sensitivity and dynamic range vary from one type of sensor to another depending on how the sensors are configured.

FIG. 3 is a diagram showing the structure of a signal charge sensor, with its adjacent circuitry of a solid-state imaging device in which a floatingdiffusion amplifier is used for signal charge sensing. A p-type substrate 31 and an n+ layer 32 form a floating-diffusion diode FD, while an n+ layer 33 forms a reset drain RD. A line RS indicates a reset gate. The floating-diffusion diode FD is connected to the gate of an amplifier transistor TR31 by a connecting line 34. The floating-diffusion diode FD, the connecting line 34, the transistor TR31, the reset drain RD, and the reset gate RS constitute the signal charge sensor.

The floating-diffusion diode FD senses the signal charge reaching the final stage (end portion) of a horizontal CCD formed below an output electrode OG and produces an output voltage $V_{out}$ to deliver to the connecting line 34. The floating-diffusion diode FD has a floating capacitance C1 between the n+ layer 32 and the output electrode OG, a floating capacitance C2 between the n+ layer 32 and the reset gate RS, and a capacitance Cd between the n+ layer 32 and the p-type substrate 31. The line 34 has a floating capacitance Cg. Therefore, when the values of the floating capacitances C1, C2, and Cg are denoted as c1, c2, and cg, respectively, and the value of the capacitance Cd as cd, the capacitance cfd of a capacitor CFD formed in the signal charge sensor having the floating-diffusion diode FD and the connecting line 34 can be given by $$cfd = c1 + c2 + cg + cd \quad \text{Equation (1)}$$

On the other hand, the output voltage $V_{out}$ of the signal charge sensor can be given by $$V_{out} = Q_{sig}/cfd \quad \text{Equation (2)}$$

where $Q_{sig}$ is the amount of signal charge sensed by the signal charge sensor.

Therefore, when the capacitance cfd of the capacitor CFD in the signal charge sensor is made variable, the output voltage $V_{out}$ of the signal charge sensor can be made variable. For example, when a variable capacitance diode is connected in parallel to the signal charge sensor, the signal charge sensor can be made to provide a variable output voltage. In this case, however, the capacitance of the signal charge sensor increases by the variable capacitance diode connected in parallel to it, and hence, the output voltage of the signal charge sensor decreases.

Generally, solid-state imaging devices utilizing CCDs are provided with only one signal charge sensor that forms the output part thereof. Therefore, when it is desired to use the aforementioned solidstate imaging device in a darker place than usual, the external circuit provided external to the solid-state imaging device for amplifying the output signal of the signal charge sensor has to be switched over to another external circuit having a higher gain. Thus, the solid-state imaging device having only one signal charge sensor has the disadvantage in that the cost and size of the external circuit increase.

To overcome the above disadvantage, it has been known to provide a solid-state imaging device as shown in FIG. 2. The solid-state imaging device shown comprises vertical CCDs 21 arranged in rows and a horizontal CCD 22 connected to the vertical CCDs 21. To the final stage of the horizontal CCD 22 are connected three signal charge sensors 23, 25, and 26, arranged parallel to each other and having different sensitivities, dynamic ranges, etc. With this arrangement, one of the three signal charge sensors 23, 25, and 26 is selected that can provide the most suitable characteristics according to the conditions of use of the solid-state imaging device. As a result, there is no need to switch over the external circuit according to the conditions of use of the solid-state imaging device, which makes it possible to hold down the cost and reduce the size of the external circuit.

However, in the above prior art solid-state imaging device, since the final stage of the horizontal CCD 22 is connected to the three signal charge sensors 23, 25, and 26, arranged parallel to each other, the result is that the combined capacitances of the signal charge sensors 23, 25, and 26 are connected to the final stage of the horizontal CCD 22. This means that a greater capacitance is connected to the final stage of the horizontal CCD 22 than when only one signal charge sensor is connected. The resulting problem is that the output voltage that each of the signal charge sensors 23, 25, and 26 produces in response to the signal charge from the horizontal CCD 22 drops because of the large capacitance, which can render the solid state imaging device unserviceable.

SUMMARY OF THE INVENTION

The solid-state imaging device of this invention, which overcomes the above-discussed and numerous other disadvantages and deficiencies of the prior art, comprises: photoelectric converting means for receiving light and converting said light to signal charges; charge transfer means for receiving said signal charges and transferring said signal charges to an end portion of said charge transfer means; a plurality of signal charge sensors having different characteristics, said signal charge sensors sensing said signal charges which are transferred to said end portion of said charge transfer means; and a CCD-structured branching unit for selecting one signal charge sensor having characteristics suitable for the conditions of use from among said plurality of signal charge sensors and forming a signal charge transmission path leading from said end portion of said charge transfer means to said selected signal charge sensor.

In a preferred embodiment, said charge transfer means comprises vertical charge coupled devices arranged in rows and a horizontal charge coupled device connected to said vertical charge coupled devices, and said end portion of said charge transfer means is an end portion of said horizontal charge coupled device.

According to the above configuration, the CCD-structured branching unit is provided to select one signal charge sensor having characteristics suitable for the conditions of use from among the plurality of signal charge sensors each having different characteristics and to form a signal charge transmission path leading from the horizontal CCD to the selected signal charge sensor. As a result, there is no need to switch over the external circuit of the solid-stage imaging device according to the conditions of use, which makes it possible to hold down the cost and reduce the size of the external circuit. Furthermore, since the formation of the transmission path serves to connect only the selected signal charge sensor to the final stage of the horizontal CCD, the result is that only the capacitance of the selected signal charge sensor is connected to the final stage of the horizontal CCD. Accordingly, unlike the prior art example in which a plurality of signal charge sensors, arranged in parallel to each other, are connected to the final stage of the horizontal CCD, the capacitance connected to the final stage of the horizontal CCD can be prevented from increasing when compared with the configuration having only one signal charge sensor. Therefore, the provision of the plurality of signal charge sensors does not contribute to decreasing the output voltage of each of the signal charge sensors.

Thus, the invention described herein makes possible the objective of providing a solid-state imaging device that is provided with a plurality of signal charge sensors having different characteristics and that can select one signal charge sensor having characteristics suitable for the conditions of use, while preventing the output voltage of the selected signal charge sensor from dropping because of the provision of the plurality of signal charge sensors.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
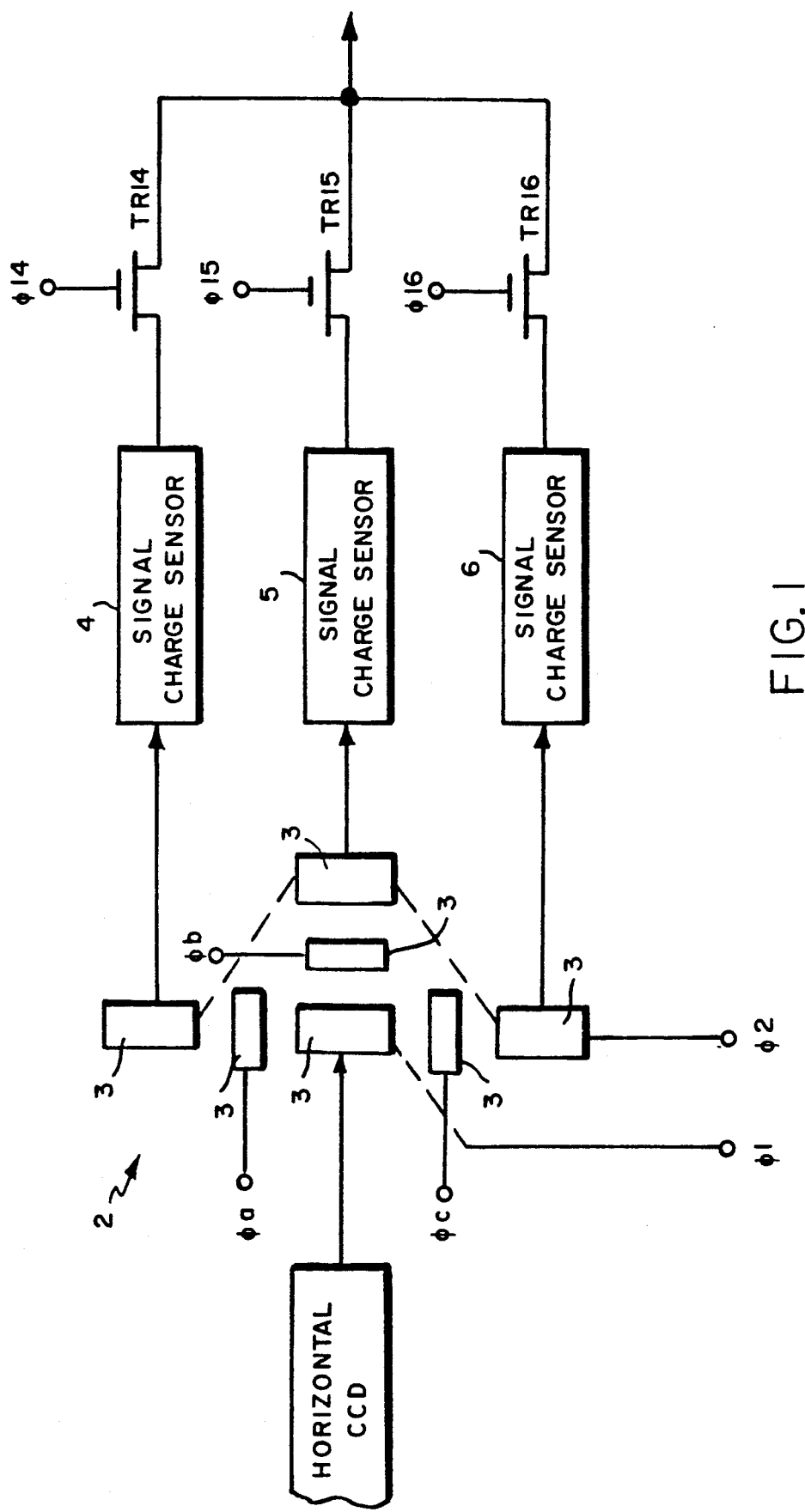
FIG. 1 is a block diagram showing a CCD-structured branching unit in a solid-state imaging device according to the present invention.
Figure 2:
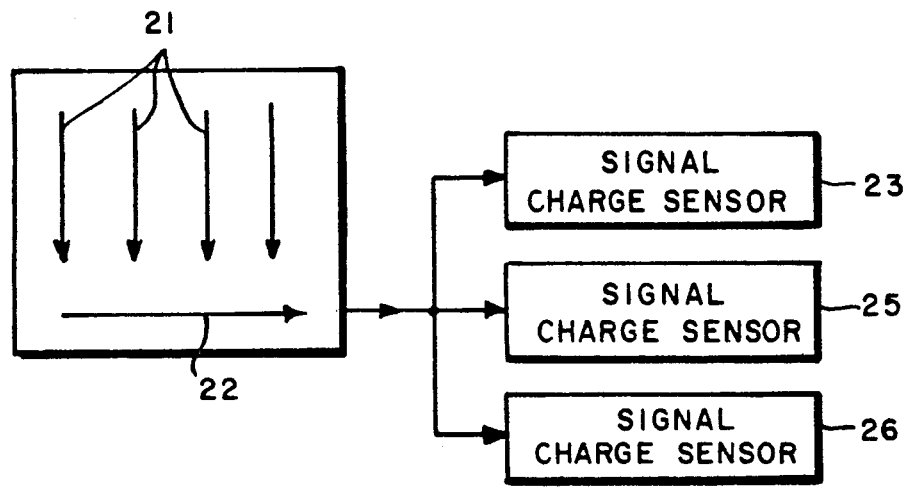
FIG. 2 is a schematic diagram showing a prior art solid-state imaging device which comprises three signal charge sensors arranged parallel to each other and having different sensitivities, dynamic ranges, etc.
Figure 3:
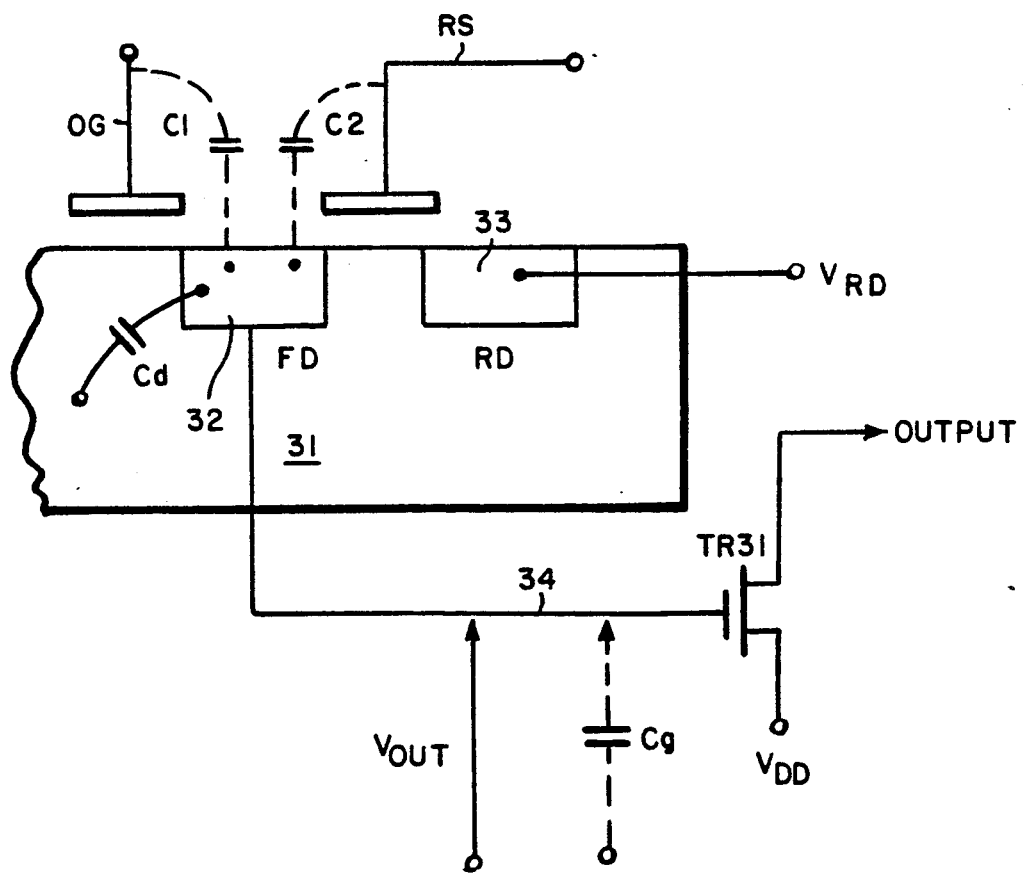
FIG. 3 is a diagram showing the structure of a signal charge sensor, with its adjacent circuitry, of a solid-state imaging device in which a floatingdiffusion amplifier is used for signal charge sensing.

The solid-state imaging device of the present invention will now be described in detail by way of example with reference to the accompanying drawings. FIG. 1 is a block diagram showing signal charge sensors, with their adjacent circuitry, of the solid-state imaging device according to the present invention. As shown in FIG. 1, the solid-state imaging device of this embodiment has a CCD-structured branching unit 2 adjacent to the final stage (end portion) of a horizontal CCD 1. The horizontal CCD 1 receives signal charges generated by photodiodes which are arranged in an array of rows and columns through vertical CCDs (not shown in FIG. 1). The horizontal CCD 1 transfers the signal charges to the end portion of the horizontal CCD 1 according to potential levels of pulse signals $\phi 1$ and $\phi 2$ which are applied on gate electrodes of the horizontal CCD 1.

The CCD-structured branching unit 2 is configured so as to form a signal charge transmission path leading from the final stage (end portion) of the horizontal CCD 1 to one signal charge sensor selected from among the three signal charge sensors 4, 5, and 6 by applying pulse signals $\phi a$, $\phi b$, $\phi c$, $\phi 1$, and $\phi 2$ to transfer electrodes 3, 3, ... of the branching unit 2. The signal charge transmission path is formed as a CCD channel under the transfer electrodes 3. The signal charges are transferred through the signal charge transmission path (CCD channel) according to the surface potential variation of a semiconductor chip. This surface potential variation is caused by applying the pulse signals $\phi a$, $\phi b$, $\phi c$, $\phi 1$, and $\phi 2$ to the transfer electrodes 3.

The three signal charge sensors 4, 5, and 6 each have the function of sensing the signal charge reaching the final stage of the horizontal CCD 1. Also, the three signal charge sensors 4, 5, and 6 have respectively different sensitivities and dynamic ranges. The three signal charge sensors 4, 5, and 6 are connected to an external circuit via transistors TR14, TR15, and TR16, respectively. The transistors TR14, TR15, and TR16 are made to conduct when respective gate voltages $\phi 14$, $\phi 15$, and $\phi 16$ are applied.

The solid-state imaging device is configured so that, when the pulse signals $\phi a$, $\phi b$, $\phi c$, $\phi 1$, and $\phi 2$ are applied to the transfer electrodes 3, 3, ... of the CCD-structured branching unit 2, one signal charge sensor that suits the conditions of use is selected from among the three signal charge sensors 4, 5, and 6 each having different characteristics, and a signal charge transmission path is formed leading from the final stage of the horizontal CCD 1 to the signal charge sensor selected as suitable for the conditions of use. Therefore, there is no need to switch over the external circuit according to the conditions of use, which makes it possible to hold down the cost and reduce the size of the external circuit.

Furthermore, since the formation of the transmission path serves to connect only one signal charge sensor, selected as suitable for the conditions of use, to the final stage of the horizontal CCD 1, the result is that only the capacitance of the signal charge sensor selected as suitable for the conditions of use is connected to the final stage of the horizontal CCD 1. Thus, according to this embodiment, unlike the prior art example in which three signal charge sensors, arranged in parallel to each other, are connected to the final stage of the horizontal CCD, the capacitance connected to the final stage of the horizontal CCD 1 can be prevented from increasing when compared with the configuration having only one signal charge sensor. Therefore, the output voltages of the signal charge sensors 4, 5, and 6 can be prevented from dropping because of the provision of the three signal charge sensors 4, 5, and 6.

Figure 4:
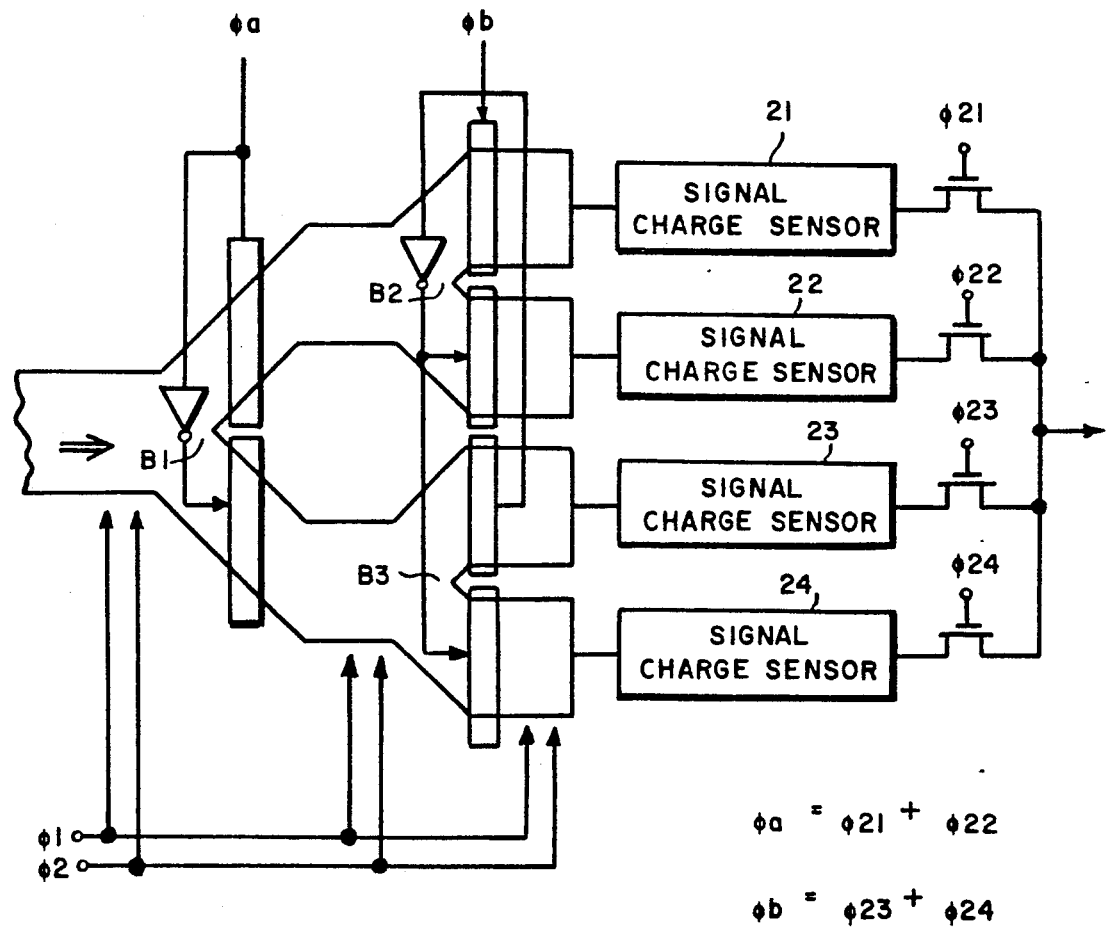
FIG. 4 shows another CCD-structured branching unit in a solid-state imaging device according to the invention.

FIG. 4 shows another CCD-structured branching unit in a solid-state imaging device of the invention. The CCD-structured branching unit is formed by two-branches-sections B1, B2 and B3, as shown in FIG. 4. At the two-branches-section B1, any one of two branches of the two-branches-section B1 is selected based on the potential of the pulse signal $\phi a$. At the two-branches-sections B2 and B3, any one of two branches of each of the two-branches-sections B2 and B3 is selected based on the potential of the pulse signal $\phi b$. The CCD-structured branching unit is so configured that, when the pulse signals $\phi a$, $\phi b$, $\phi 1$, and $\phi 2$ are applied to the transfer electrodes (not shown in FIG. 4) of the CCD-structured branching unit, one signal charge sensor that suits the conditions of use is selected from among four signal charge sensors 21, 22, 23 and 24 each having different characteristics, and a signal charge transmission path is formed leading from the final stage of the horizontal CCD to the signal charge sensor selected as suitable for the conditions of use. In the CCD-structured branching unit, when the pulse signals $\phi a$ and $\phi b$ are High, the signal charge sensor 21 is selected. When the pulse signals $\phi a$ and $\phi b$ are Low, the signal charge sensor 24 is selected. The relationship between the potential levels (High or Low) of the pulse signals $\phi a$ and $\phi b$ and the selected one of the signal charge sensors 21, 22, 23 and 24 is shown in Table 1.

TABLE 1

|  |  | $\phi_b$ | |
|---|---|---|---|
|  |  | High | Low |
| $\phi_a$ | High | Signal charge sensor 21 | Signal charge sensor 22 |
|  | Low | Signal charge sensor 23 | Signal charge sensor 24 |

As seen from the above, according to the CCD-structured branching unit as shown in FIG. 4, the application of the pulse signal $\phi c$ to the transfer electrodes is not needed in order to select one among the four signal charge sensors 21, 22, 23 and 24. In the embodiment of the invention, the pulse signal $\phi a$ is made by adding a gate voltage $\phi 21$ to a gate voltage $\phi 22$, and the pulse signal $\phi b$ is made by adding a gate voltage $\phi 23$ to a gate voltage $\phi 24$.

As is apparent form the above description, since the solid-state imaging device of the invention is provided with a CCD-structured branching unit, it is possible to select one signal charge sensor having characteristics suitable for the conditions of use from among a plurality of signal charge sensors having different characteristics and to form a signal charge transmission path leading from the horizontal CCD to the selected signal charge sensor. As a result, there is no need to switch over the external circuit of the solid-state imaging device according to the conditions of use, which makes it possible to hold down the cost and reduce the size of the external size.

Furthermore, since the formation of the transmission path serves to connect only the selected signal charge sensor to the final stage of the horizontal CCD, the result is that only the capacitance of the selected signal charge sensor is connected to the final stage of the horizontal CCD. Thus, according to the present invention, unlike the prior art example in which a plurality of signal charge sensors, arranged in parallel to each other, are connected to the final stage of the horizontal CCD, the capacitance connected to the final stage of the horizontal CCD can be prevented from increasing when compared with the configuration having only one signal charge sensor. Therefore, according to the present invention, the output voltage of each of the signal charge sensors can be prevented from dropping because of the provision of the plurality of signal charge sensors.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A solid-state imaging device comprising:
   photoelectric converting means for receiving light and converting said light to signal charges;
   charge transfer means for receiving said signal charges and transferring said signal charges to an end portion of said charge transfer means; a plurality of signal charge sensors each having different characteristics, said signal charge sensors sensing said signal charges which are transferred to said end portion of said charge transfer means; and
   a CCD-structured branching unit for selecting one signal charge sensor having characteristics suitable for the conditions of use from among said plurality of signal charge sensors and forming a signal charge transmission path leading from said end portion of said charge transfer means to said selected signal charge sensor.

2. A solid-state imaging device according to claim 1, wherein said charge transfer means comprises vertical charge-coupled devices arranged in rows and a horizontal charge-coupled device connected to said vertical charge-coupled devices, and said end portion of said charge transfer means is an end portion of said horizontal charge-coupled device.

3. The solid state imaging device of claim 1 wherein the CCD-structured branching unit has a plurality of transfer electrodes, and the device has means for applying pulse signals to the electrodes to form a single charge transmission path leading from the end portion of the charge transfer means to a selected one of the signal charge sensors.

4. The solid state imaging device of claim 1 wherein the CCD-structure branching unit has a first stage containing one two-branch section for providing two alternative paths and a second stage containing two two-branch sections, each providing two alternative paths, such that each path from the first stage has two alternative paths from the second stage, and the device has means for applying pulse signals to each of the two-branch sections to select a single charge transmission path leading from the end portion of the charge transfer means to a selected one of the signal charge sensors.

* * * * *